United States Patent
Baumann et al.

(10) Patent No.: US 9,111,938 B2
(45) Date of Patent: Aug. 18, 2015

(54) COPPER INTERCONNECT WITH CVD LINER AND METALLIC CAP

(71) Applicants: International Business Machines Corporation, Armonk, NY (US); GLOBALFOUNDRIES Inc., Grand Cayman (KY); Renesas Electronic Corporation, Kanagawa (JP); STMICROELECTRONICS, INC., Coppell, TX (US)

(72) Inventors: Frieder H. Baumann, Red Bank, NJ (US); Tibor Bolom, Litomerice (CZ); Chao-Kun Hu, Somers, NY (US); Koichi Motoyama, Clifton Park, NY (US); Chengyu Niu, Niskayuna, NY (US); Andrew H. Simon, Fishkill, NY (US)

(73) Assignees: International Business Machines Corporation, Armonk, NY (US); GLOBALFOUNDRIES, INC., Grand Cayman Islands (KY); Renesas Electronics Corporation, Kanagawa (JP); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/538,944

(22) Filed: Nov. 12, 2014

(65) Prior Publication Data

US 2015/0061135 A1    Mar. 5, 2015

Related U.S. Application Data

(62) Division of application No. 13/451,947, filed on Apr. 20, 2012.

(51) Int. Cl.
*H01L 23/532* (2006.01)
*H01L 21/768* (2006.01)

(52) U.S. Cl.
CPC .... *H01L 23/53238* (2013.01); *H01L 21/76843* (2013.01); *H01L 21/76849* (2013.01); *H01L 21/76873* (2013.01); *H01L 21/76804* (2013.01); *H01L 2924/0002* (2013.01)

(58) Field of Classification Search
CPC .................................................. H01L 21/76804
USPC ............ 257/774, E21.577, E21.578, E21.585
See application file for complete search history.

(56) References Cited

U.S. PATENT DOCUMENTS 6,181,012 B1    1/2001    Edelstein et al.
6,303,505 B1   10/2001    Ngo et al.
(Continued)

FOREIGN PATENT DOCUMENTS

JP         2001144090 A        5/2001

OTHER PUBLICATIONS

U.S. Appl. No. 13/451,947, entitled: "Copper Interconnect with CVD Liner and Metallic Cap", filed Apr. 20, 2012.

*Primary Examiner* — Mohammad Choudhry
(74) *Attorney, Agent, or Firm* — L. Jeffrey Kelly; Yuanmin Cai

(57) ABSTRACT

A structure having a diffusion barrier positioned adjacent to a sidewall and a bottom of an opening being etched in a layer of dielectric material. The structure also having a metal liner positioned directly on top of the diffusion barrier, a seed layer positioned directly on top of the metal liner, wherein the seed layer is made from a material comprising copper, a copper material positioned directly on top of the seed layer, a metallic cap positioned directly on top of and selective to the copper material, and a capping layer positioned directly on top of and adjacent to the metallic cap.

8 Claims, 4 Drawing Sheets

(56) References Cited

U.S. PATENT DOCUMENTS

| | | |
|---|---|---|
| 6,355,567 B1 | 3/2002 | Halle et al. |
| 6,528,884 B1 | 3/2003 | Lopatin et al. |
| 6,630,741 B1 | 10/2003 | Lopatin et al. |
| 6,977,220 B2 | 12/2005 | Marieb et al. |
| 7,220,674 B2 | 5/2007 | Marieb et al. |
| 7,256,121 B2 * | 8/2007 | Yue et al. ............ 438/625 |
| 7,494,916 B2 | 2/2009 | Hsu et al. |
| 2006/0216932 A1 | 9/2006 | Kumar et al. |
| 2007/0287277 A1 | 12/2007 | Kolics et al. |
| 2009/0004850 A1 | 1/2009 | Ganguli et al. |
| 2010/0237501 A1 | 9/2010 | Tomizawa et al. |

\* cited by examiner

COPPER INTERCONNECT WITH CVD LINER AND METALLIC CAP

BACKGROUND

The present invention generally relates to integrated circuits, and particularly to copper interconnect structures.

Copper interconnects provide the primary connectivity and/or electrical pathway within a semiconductor device. Copper may be the primary element used to form such interconnects because of its electrical conductive properties. Copper interconnects can be formed within an opening or multiple openings etched in a layer of dielectric material. These openings commonly take the shape of wires, trenches, or vias. A diffusion barrier may be used to prevent diffusion of copper into the surrounding dielectric material. A copper seed layer can be deposited prior to filling the opening with copper using an electroplating technique. The opening(s) etched in the layer of dielectric can have re-entrant features which can prevent adequate deposition of the copper seed layer. Poor or inadequate copper seed layer coverage results in poor electroplating of the copper and poor electromigration characteristics. A capping layer may be deposited to separate multiple stacked layers of dielectric material and corresponding copper interconnects.

SUMMARY

According to one embodiment of the present disclosure, a structure having a diffusion barrier positioned adjacent to a sidewall and a bottom of an opening being etched in a layer of dielectric material is provided. The structure having a metal liner positioned directly on top of the diffusion barrier, a seed layer positioned directly on top of the metal liner, wherein the seed layer is made from a material comprising copper, a copper material positioned directly on top of the seed layer, a metallic cap positioned directly on top of and selective to the copper material, and a capping layer positioned directly on top of and adjacent to the metallic cap.

According to another exemplary embodiment of the present disclosure, a method of depositing a diffusion barrier within an opening etched in a layer of dielectric material, wherein the opening comprises a bottom and a sidewall having a re-entrant feature is provided. The method including depositing a metal liner directly on top of the diffusion barrier, depositing a seed layer of copper directly on top of the metal liner, filling the opening etched in the layer of dielectric material with a copper material, wherein filling the opening the copper material is deposited directly on top of the seed layer, depositing a metallic cap selective to and directly on top of the copper material, and depositing a capping layer directly on top of and adjacent to the metallic cap.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it is understood that the disclosed embodiments are merely illustrative of the claimed structures and methods that may be embodied in various forms. This disclosure may, however, be embodied in many different forms and should not be construed as limited to the exemplary embodiment set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1A:
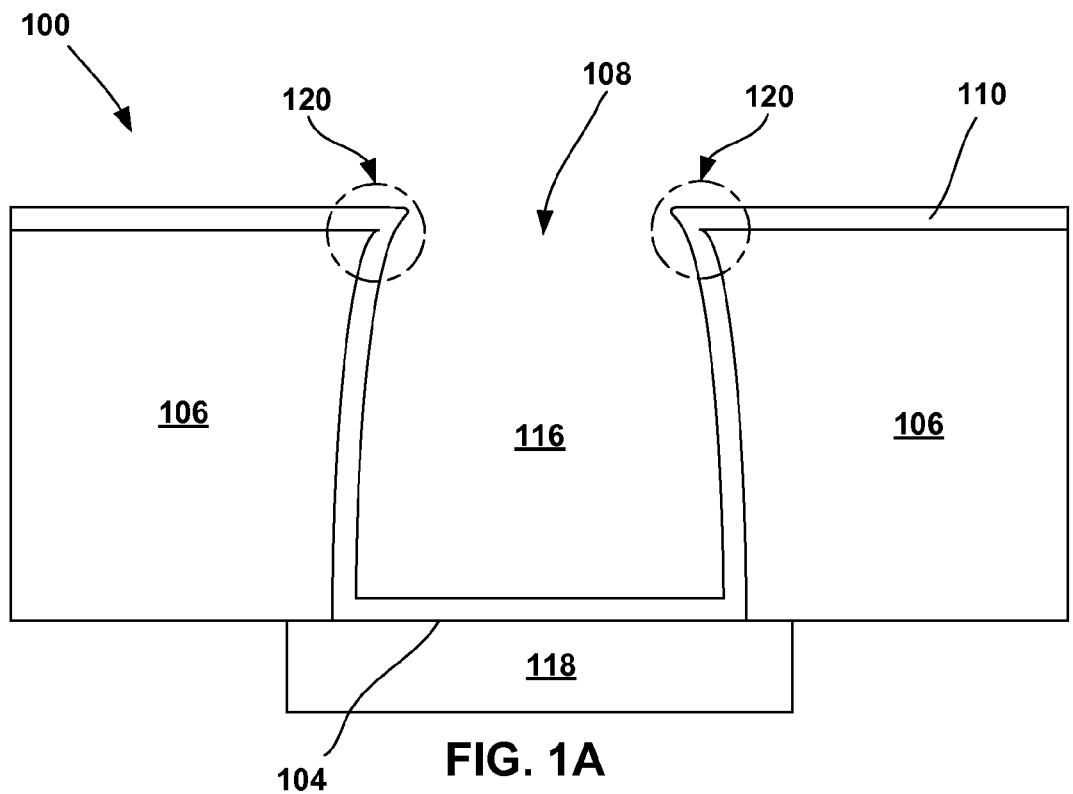
FIG. 1A is vertical cross-sectional view depicting an opening etched in a layer of dielectric material and having a diffusion barrier deposited therein according to one embodiment.

FIG. 1A illustrates a cross-sectional view of a step of a method in forming a copper interconnect 100. The step includes creating an opening 108 in a layer of dielectric material 106, which exposes a copper pad 118 positioned at a bottom 104 of the opening 108. The copper interconnect 100 may include, for example, copper lines, copper wires and copper vias. The copper pad 118 may include, for example, a copper line, a copper wire or a copper via. For example, the copper interconnect 100 may alternatively include a trench etched in the layer of dielectric material 106 without the copper pad 118. The opening 108 etched in the layer of dielectric material 106 may also include a re-entrant feature 120. The re-entrant feature 120 is defined by the opening 108 having an increasing diameter or width as a function of its depth. Therefore the diameter or width of the opening 108 is smaller at a top of the opening 108 than at the bottom 104 of the opening 108.

A diffusion barrier 110 can be deposited directly on top of the layer of dielectric material 106. The diffusion barrier 110 may be made from any material that prohibits contamination of copper by the layer of dielectric material 106. For example, the diffusion barrier 110 may be made from a material including a compound of tantalum nitride deposited by physical vapor deposition (PVD). Alternative deposition techniques, for example, chemical vapor deposition (CVD) or atomic layer deposition (ALD), may also be used to deposit the diffusion barrier 110. Deposition of the diffusion barrier 110 may not be affected by the re-entrant feature 120.

Conventionally, a seed layer is deposited within the opening 108 on top of the diffusion layer 110 using, for example, a physical vapor deposition (PVD) process which operates under a line-of-site principle. However, it has been observed that these PVD processes are unable to adequately deposit a uniform or adequate seed layer because of the existence of the re-entrant feature 120.

Figure 1B:
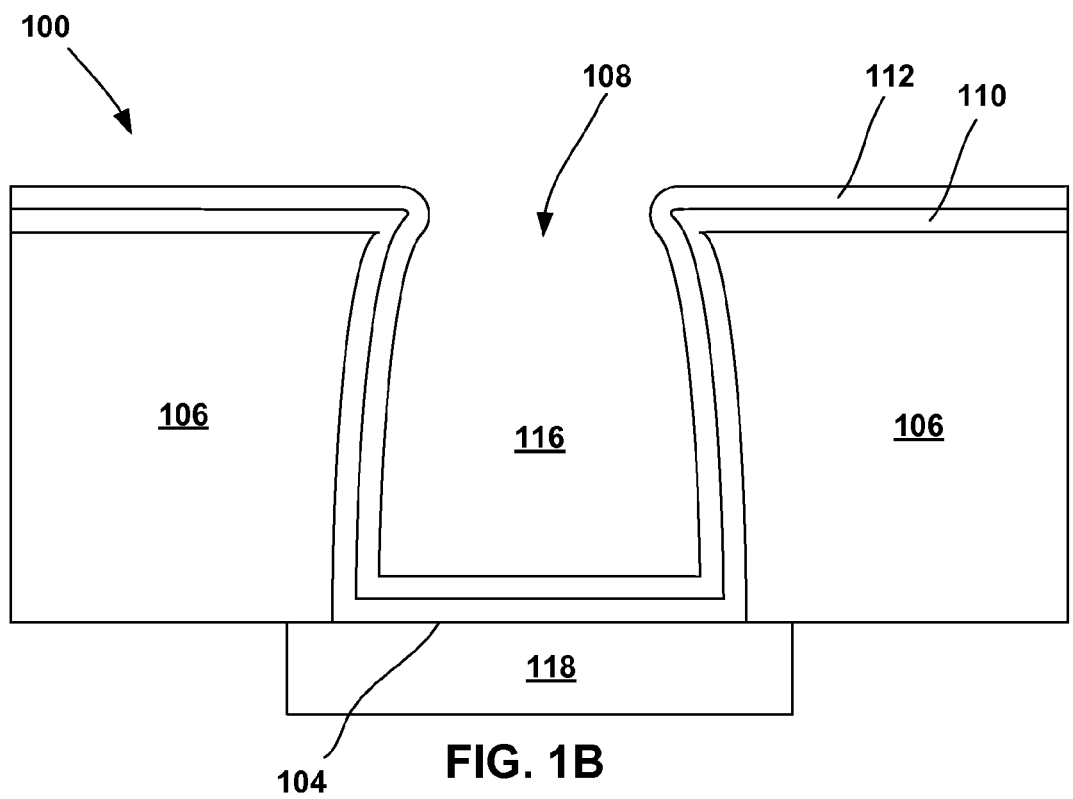
FIG. 1B depicts the formation of a metal liner deposited on top of the diffusion barrier according to one embodiment.

FIG. 1B illustrates a cross-sectional view of a step of a method of forming the copper interconnect 100. The step includes depositing a metal liner 112 on top of the diffusion barrier 110. For example, the metal liner 112 may be deposited using a metalorganic chemical vapor deposition (MOCVD) technique. The metal liner 112 may be made from a material including, for example, cobalt deposited using a CVD technique with a dicobalt hexacarbonyl butylacetylene (CCTBA) precursor. For example, the metal liner 112 may alternatively be made from a material including cobalt, ruthenium or some other suitable metal liner deposited using other known deposition techniques.

Figure 1C:
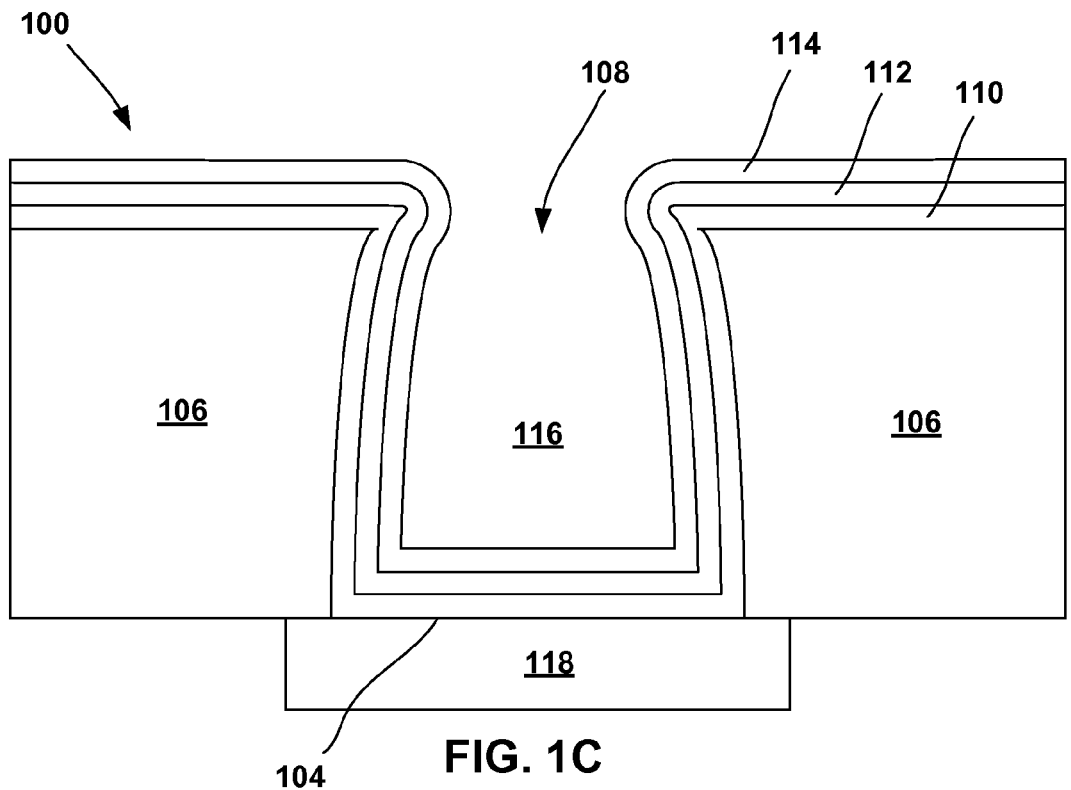
FIG. 1C depicts the formation of a copper seed layer deposited on top of the metal liner according to one embodiment.

FIG. 1C illustrates a cross-sectional view of a step of a method of forming the copper interconnect 100. The step includes depositing a copper seed layer 114 on top of the metal liner 112 using a PVD technique. For example, the copper seed layer 114 may alternatively be deposited using either a CVD or an ALD technique. The copper seed layer 114 may include, for example, a dopant. The dopant may be defined as a trace impurity element that is inserted into the copper seed layer 114. The dopant concentration may be less than 10%, but preferably less than 1% in weight. For example, the dopant may be made from a material including, but not limited to, manganese or aluminum.

The metal liner 112 can be used because of its increased affinity for copper and to assure the subsequent deposition of a continuous and uniform copper seed layer 114. A uniform seed layer can have equal thickness throughout. Without the use of the metal liner 112, conventional PVD of the copper seed layer 114 can yield inadequate coverage and non-uniform thickness along the diffusion barrier layer 110 due to the re-entrant feature 120. After deposition of the metal liner 112, the structure can be exposed to a hydrogen plasma treatment used to drive impurities out of the metal liner 112.

Figure 1D:
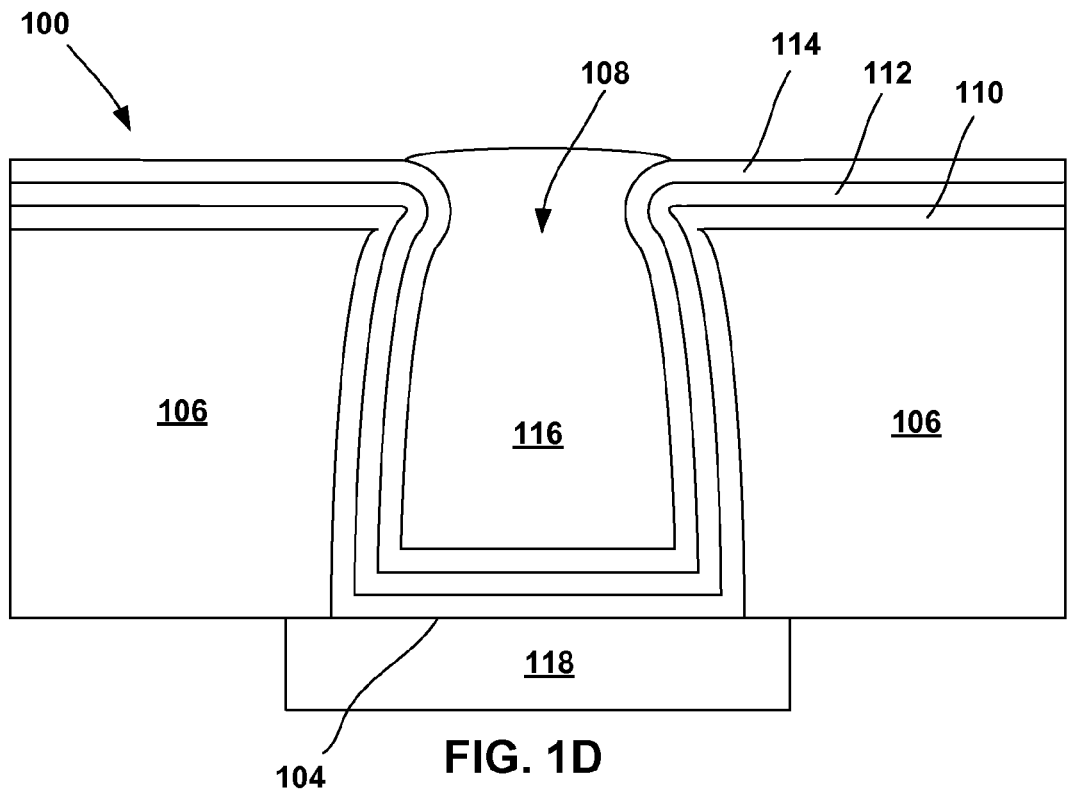
FIG. 1D depicts the formation of a copper material deposited on top of the copper seed layer using an electroplating technique according to one embodiment.

FIG. 1D illustrates a cross-sectional view of a step of a method of forming the copper interconnect 100. The step includes depositing a copper material 116 from an electrolyte solution on the copper seed layer 114 within the opening 108. The copper seed layer 114 acts as a cathode to which an electrical potential is applied during the electroplating process. Specifically, a negative voltage is applied to the copper seed layer 114. Use of the metal liner 112 can result in dramatically lower defect densities in the copper material 116, resulting in exceptional electromigration resistance.

Figure 1E:
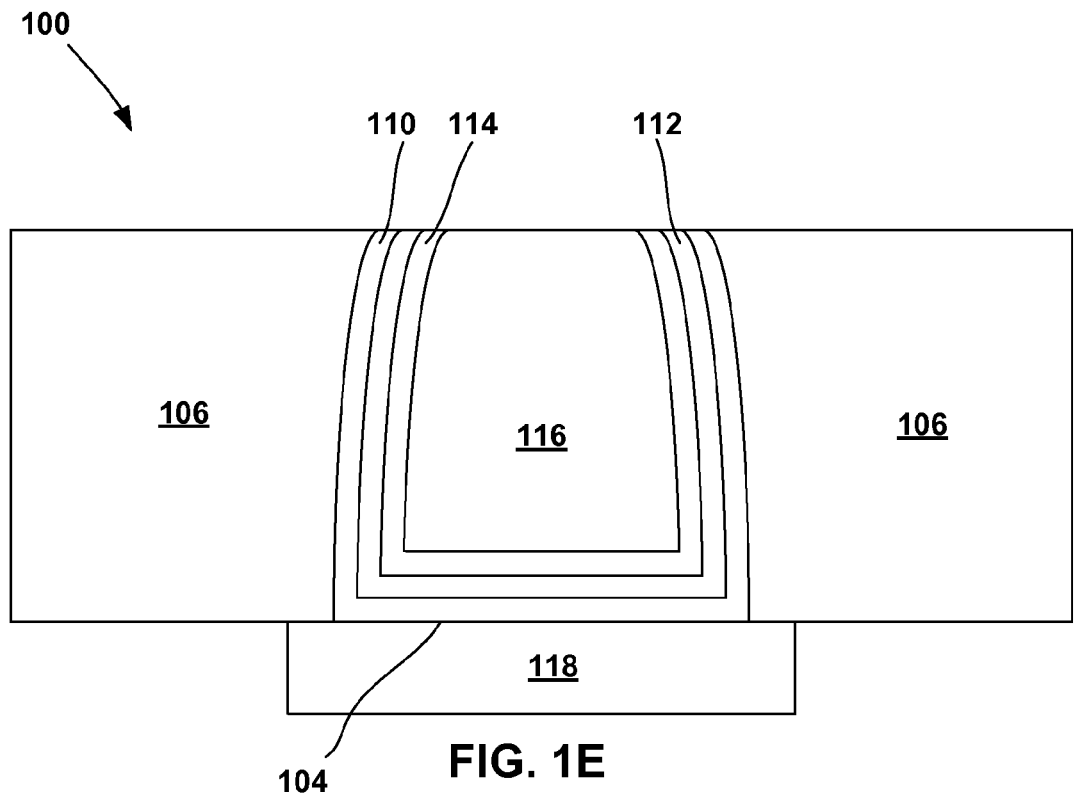
FIG. 1E depicts smoothing of the layer of dielectric material's top surface after a chemical mechanical polishing process according to one embodiment.

FIG 1E illustrates a cross-sectional view of a step of a method of forming the copper interconnect 100. The step includes using a chemical mechanical polishing (CMP) process to smooth and flatten a top surface of the layer of dielectric material 106. The CMP process can be used to remove the diffusion barrier 110, the metal liner 112, and excess copper material 116 selective to the top surface of the layer of dielectric material 106.

Figure 1F:
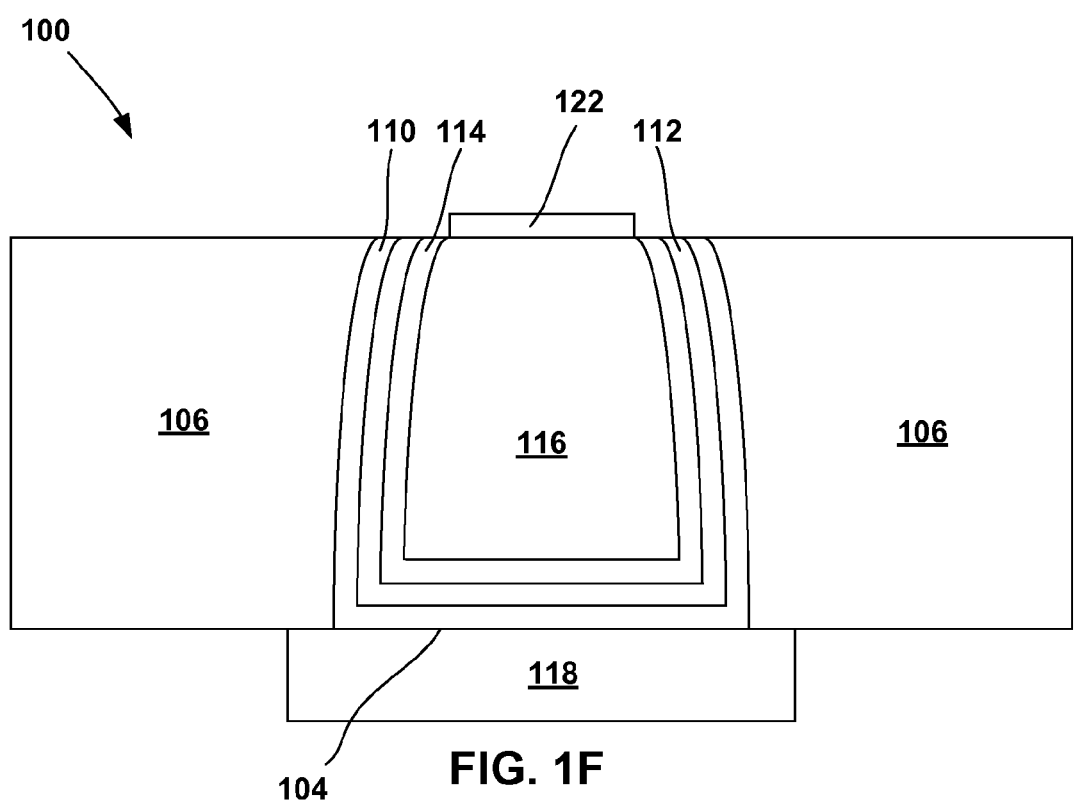
FIG. 1F depicts the formation of a metallic cap deposited on the copper material according to one embodiment.

FIG. 1F illustrates a cross-sectional view of a step of a method of forming the copper interconnect 100. The step includes depositing a metallic cap 122 selectively onto the copper material 116. For example, the metallic cap 122 may include a compound of cobalt tungsten phosphate (CoWP). The metallic cap 122 may also include, for example, cobalt, ruthenium, manganese or some other suitable metal deposited using a CVD or plating technique. The metallic cap 122 grows preferentially to the copper material 116 and not on the layer of dielectric material 106. The metallic cap 122 may be used due to its superior adhesion to the copper material 116.

Figure 1G:
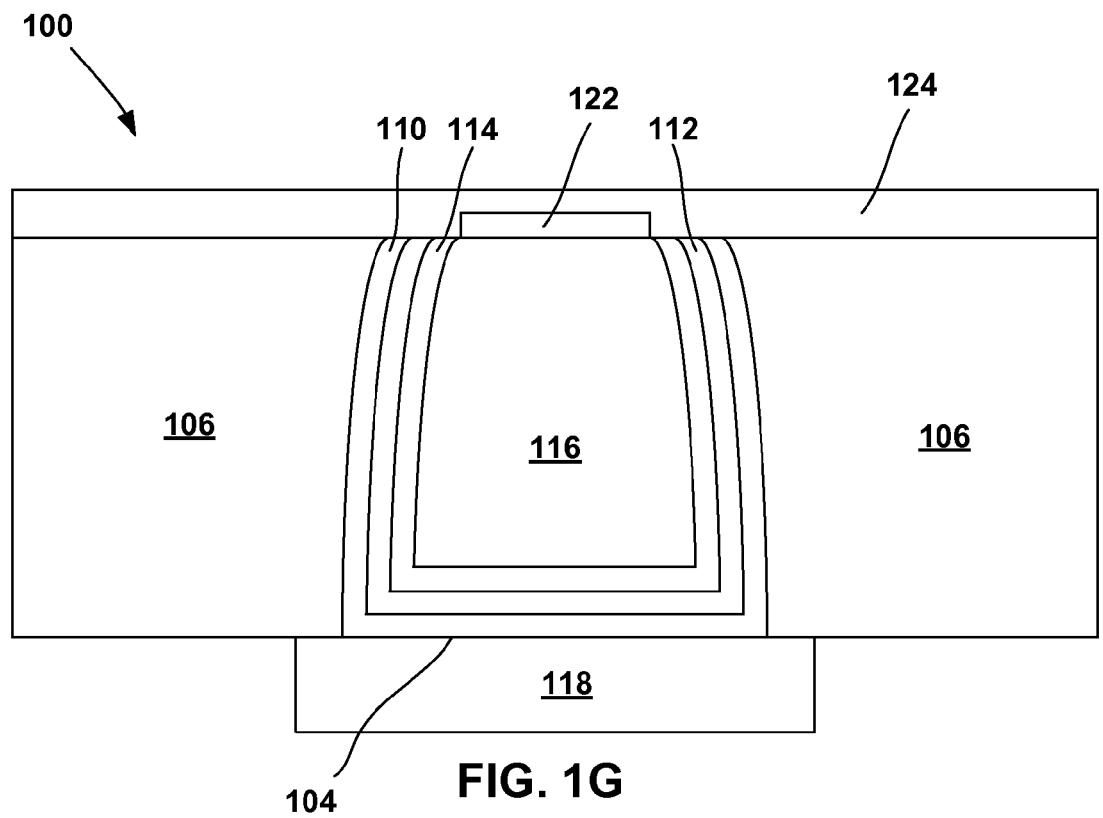
FIG. 1G depicts the final structure after the formation of a capping layer is deposited according to one embodiment.

FIG. 1G illustrates a cross-sectional view of a step of a method of forming the copper interconnect 100. The step includes depositing a capping layer 124 on top of and adjacent to the layer of dielectric material 106 and the metallic cap 122. For example, the capping layer 124 may include, but is not limited to, silicon nitride or silicon carbon nitride.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A structure comprising:
   a diffusion barrier positioned adjacent to a sidewall having a re-entrant feature and a bottom of an opening being etched in a layer of dielectric material;
   a metal liner positioned directly on top of the diffusion barrier;
   a seed layer positioned directly on top of the metal liner, wherein the seed layer is made from a material comprising copper;
   a copper material positioned directly on top of the seed layer;
   a metallic cap positioned directly on top of and selective to the copper material; and
   a capping layer positioned directly on top of and adjacent to the metallic cap;
   wherein, the diffusion barrier, the metal liner, the seed layer, and the copper material having the re-entrant feature.

2. The structure of claim 1, wherein the metal liner is made from a material that comprises cobalt.

3. The structure of claim 1, wherein the metal liner is made from a material that comprises ruthenium.

4. The structure of claim 1, wherein the metallic cap is made from a material that comprises a compound of cobalt tungsten phosphate.

5. The structure of claim 1, wherein the metallic cap is made from a material that is selected from the group consisting of cobalt, and ruthenium.

6. The structure of claim 1, wherein the copper of the seed layer comprises a dopant.

7. The structure of claim 6, wherein the dopant is selected from the group consisting of manganese, aluminum, tin, indium, zinc, and zirconium.

8. The structure of claim 1, wherein the capping layer is made from a material that comprises a compound of silicon nitride or a compound of silicon carbon nitride.

* * * * *